United States Patent [19]

Komonytsky

[11] Patent Number: 4,519,078
[45] Date of Patent: May 21, 1985

[54] LSI SELF-TEST METHOD

[75] Inventor: Donald Komonytsky, Boulder, Colo.

[73] Assignee: Storage Technology Corporation, Louisville, Colo.

[21] Appl. No.: 426,451

[22] Filed: Sep. 29, 1982

[51] Int. Cl.³ ............................................. G01R 31/28
[52] U.S. Cl. ................................. 371/25; 324/73 AT; 324/73 R; 371/27
[58] Field of Search ........................ 371/25, 26, 27, 15; 324/73 R, 73 AT; 364/716

[56] References Cited

U.S. PATENT DOCUMENTS

| | | | |
|---|---|---|---|
| 3,761,695 | 9/1973 | Eichelberger | 371/25 |
| 3,783,254 | 1/1974 | Baxter | 364/716 |
| 4,298,980 | 11/1981 | Hajdu et al. | 371/25 |
| 4,435,806 | 3/1984 | Segers et al. | 371/25 |
| 4,450,560 | 5/1984 | Conner | 371/25 |
| 4,454,600 | 6/1984 | LeGresley | 371/25 |

OTHER PUBLICATIONS

Williams, T. W. et al, "A Logic Design Structure for Totability", Proc. 14th Design Automation Conference, Jun. 1977, pp. 462-468.

*Primary Examiner*—Charles E. Atkinson
*Assistant Examiner*—Michael R. Fleming
*Attorney, Agent, or Firm*—Bryant R. Gold

[57] ABSTRACT

A method of self-testing LSI circuits and/or systems in which LSI and discrete logic circuits are used that incorporates internally generated pseudorandom sequences as test vectors to stimulate the logic circuits under test. Responses to the test vectors are analyzed internally or externally using signature analysis to determine if the circuit has functioned properly. The method combines the best features of Level Sensitive Scan Design and prior art self-test methods to provide an efficient, easy to perform, self-test method that may be used at any testing level.

15 Claims, 13 Drawing Figures

FIG. 1

(PRIOR ART)

WHEN TEST = 0: SELECT 1 THROUGH X MUX
SELECT SDI THROUGH Y MUX
SELECT INTERIOR LATCHES THROUGH Z MUX

WHEN TEST = 1: SELECT EX-OR THROUGH X MUX
SELECT INPUT LATCHES THROUGH Y MUX
OUTPUT LATCHES THROUGH Z MUX

LSI SELF-TEST METHOD

BACKGROUND OF THE INVENTION

This invention relates to the self-testing of large scale integration and very large scale integration (hereinafter referred to collectively as "LSI") circuits, and more particularly to a self-test method that employs internally generated pesudorandom sequences in conjunction with level sensitive scan design and signature analysis.

Numerous methods have been proposed in recent years for testing LSI circuits. Because of the complex circuit functions and/or large quantities of circuit functions that may be present in an LSI circuit, or in a system that employs LSI circuits, such test methods have themselves become very sophisticated and complex. Unfortunately, complex test methods generally require correspondingly complex equipment, including software, and become increasingly expensive and burdensome to carry out.

One of the known test methods for testing LSI circuits, and systems employing LSI circuits, is Level Sensitive Scan Design, or "LSSD." The theory and operation of LSSD is well described in the literature. See, e.g., U.S. Pat. No. 3,761,695; U.S. Pat. No. 3,783,254; and Williams, T. W. and Eichelberger, E. B., "A Logic Design Structure for Testability", *Proc. 14th Design Automation Conference*, June 1977, pp. 462–468. Basically, LSSD has simplified LSI testing in two major ways: (1) by enhancing the controllability/observability of the LSI internal circuits, and (2) by transforming sequential circuits into combinational circuits. Advantageously, in LSSD each shift register latch (SRL) contained in the LSI circuit may become a control/observation point. Therefore, controllability/observability of the LSI circuits no longer depends on the number of pins in the package. Furthermore, because the latches are themselves part of the internal circuit, they can be used to break feedback paths in a sequential circuit, enabling that circuit to be tested combinationally. Thus, in principle, LSSD testing is performed by shifting test data into the SRL's, applying test vectors (selected words or groups of digital data) to the primary inputs of the chip, clocking the system clocks, and scanning the data out of the SRL's to compare it to known good test vectors.

From a practical point-of-view, however, LSSD is difficult to implement unless it is supported by LSSD-oriented test generation software. To illustrate, consider the design approach that is usually taken for a typical LSI chip design. A designer will produce a set of functional test vectors, using commercially available logic simulators, such as TEGAS or FLOGIC, to verify the operation of his LSI chip design. Once the design simulates as expected, these functional vectors are used in a fault simulation to obtain an initial test score, expressed as a percentage of total faults covered. Depending on the complexity of the chip and the completeness of the set of functional vectors, this initial fault coverage can range from 50 percent to over 90 percent. Additional test vectors are then produced, using whatever test generation aids are available, to bring the fault coverage up to some prespecified minimum. Needless to say, this test generation and fault simulation cycle can require a large amount of computer time and considerable manual effort on the part of the designer, depending on the sophistication of the test generation programs.

The use and operation of the above-described commercially available logic simulators is well known and documented in the art. See, e.g., Szygenda, S. A. "TEGAS2—Anatomy of a General Purpose Test Generation and Simulation System for Digital Logic", *Proceedings of the 9th ACM Design Automation Workshop*, June 1972, Dallas, Tex., pp. 116–127; Wilcox, P. and Rambeek, H., "F/LOGIC - An Interactive Fault and Logic Simulator for Digital Circuits", *PROC. 13th Design Automation Conference*, June 1976, pp. 68–73; and *CC-TDL Test Generation User and Reference Manual*, Comsat General Integrated Systems, Inc., 7801 North Lama Bldg., Austin, Tex., 1980.

Unfortunately, in order to utilize the LSSD method of testing with the commercially available logic simulators, a large set of parallel test vectors must first be serialized and then augmented with extra control vectors in order to shift them into and out of the chip. Without significant support software, the designer has to manually convert his test patterns into LSSD format and ensure that each vector has been shifted into the correct position inside the ship. Because the test generation and fault simulation are not explicity based on LSSD testing, merely serializing parallel test vectors and shifting them into the SRL's of the chip does not necessarily produce good fault coverage. Moreover, the large amount of switching activity caused by the constant shifting associated with the LSSD method leads to a dramatic increase in the computer time required for fault simulation.

It is thus seen that in order to fully realize the potential of LSSD testing, test generation software must be able to generate the required test patterns for loading into the SRL's inside the chip. Then, utilizing each SRL as a control/observation point, this software must use a deterministic (as opposed to a heuristic or random) test generation algorithm, such as the D-algorithm (see Roth, J. P., "Diagnosis of Automata Failures: A Calculus and Method," *IBM Journal of Research and Development*, Vol. 10, No. 4, 1966, pp. 278–291; and Roth, J. P. et al., "Programmed Algorithms to Compute Tests to Detect and Distinguish Between Failures in Logic Circuits," *IEEE Transactions on Electronic Computers*, vol. EC-16, October 1967, pp. 567–580), to produce an efficient set of LSSD-based test patterns and expected responses. The software must also produce the control vectors for shifting the test patterns into the SRL's and shifting the responses out. The fault coverage of the test patterns can then be computed as part of the test generation process, eliminating an additional fault simulation step. Unfortunately, such LSSD-oriented test generation software program has to be specially written, because at the present no such software is commercially available. Further, as might be expected, the writing of such an LSSD-oriented software program represents an engineering project requiring a major commitment of time and money. Hence, for many LSI chip designers without access to such a specialized test generator, LSSD testing can not be used with maximum efficiency.

Moreover, even if LSSD testing can be implemented, the test generation burden is a heavy one. As noted above, designers either have to go through a cycle of test generation and fault simulation that is largely manual, or an LSSD test generator has to be developed to automate the procedure. In either case, the end product is a sizeable set of test and response vectors that has to be catalogued and stored. Elaborate LSI testers must be used just to apply the vectors to the chip and collect the responses. In addition, the testing is time consuming because the vectors have to be serially shifted in and the responses serially shifted out. Thus, as the density of chips increases, so too does the test generation effort. What is needed, therefore, is a method of testing LSI chip designs that incorporates the advantages of LSSD, but that does not impose the software management and test generation burdens associated therewith.

One method known in the art to reduce the amount of test data that must be stored when an external test method, such as LSSD is employed, is "signature analysis." See Frohwerk, Robert A., "Signature Analysis: A New Digital Field Service Method," *Hewlett-Package Journal*, May 1977, pp. 2–8. In normal LSSD testing, the responses from the test vectors must be compared to known good test vectors. Thus, a large catalog of good test vectors must be stored in order to perform such a comparison. In contrast, signature analysis eliminates the need to generate and store such a catalog of good test vectors. Signature analysis recognizes that an inherent "signature" is present in the data streams of output test response vectors. This "signature" can be derived, and if it is still detected as being present in the response vectors, one is assured that a successful or correct response has been given by the circuit under test.

An additional method known in the art to test LSI circuits is LSI self-test. See, e.g., Sedmak, R. M., "Implementation Techniques for Self-Verification," *Proceedings of the 1980 IEEE Test Conference*, October 1979, pp 37–41; Konemann, Bernd, "Built-in Logic Block Observation Techniques," *Proceedings of the 1979 IEEE Test Conference*, October 1979, pp 37–41. Using this approach, there is no need to externally generate and apply test vectors. Rather, the circuits existing within the LSI chip design, many of which are designed thereinto soley for testing purposes, are used, insofar as possible, for this purpose. Significant advantages may be realized with LSI self-test: (1) test vectors can be generated automatically inside the chip at high speeds; (2) neither test nor response vectors need to be stored external to the chip; (3) testing can proceed at much higher speeds than is normally possible using LSI testers; (4) no expensive LSI testers are needed; (5) chips can be tested at wafer probe, after packaging, at board test, at system test, and in the field with equal ease; and (6) with proper partitioning, self-test efforts can be made largely independent of chip density.

Unfortunately, prior art LSI self-test also suffers from some significant disadvantages. Most significantly, it demands extra resources in terms of design time and chip area. Moreover, the circuit under test has to be partitioned carefully into smaller testable sections, and the designer must exercise considerable skill in mating the self-test circuits to the rest of his chip. The overall effectiveness of the self-test method depends largely on how skillfully this is done. Careless use of self-test features can waste a lot of chip real estate. There is a definite need, therefore, for a LSI test method that provides the advantages of LSI self-test but that does not require excessive design times, circuit partitioning, nor the use of a large number of test circuits that consume available chip space.

SUMMARY OF THE INVENTION

It is an object of the present invention to provide an improved LSI test method that combines the best features of LSSD and LSI self-test.

It is a further object of the present invention to provide an LSI chip that may be used with such an improved test method that is straight forward to design and that uses a minimum amount of extra chip area.

It is another object of the present invention to provide such an improved test method that may be used at any test level—wafer probe test, LSI package test, board test, system test, and field test—with equal ease and accuracy.

A further object of the invention is to provide an improved LSI-test method and chip design that employs internally generated test vectors, thereby eliminating the need for expensive and cumbersome external test vector generation circuitry and software.

Still an additional object of the invention is to incorporate into such an LSI test method and chip design the salient principles of signature analysis, thereby simplifying the analysis of the response vectors that are generated by the chip circuits under test in response to the internally generated test vectors.

Another object of the invention is to provide such an improved LSI test method that may be carried out with a minimum number of connections made to the chip under test.

An additional object of the invention is to provide an LSI chip that may be used with an LSI test method wherein the self-test circuits inside the chip are transparent to both system operation and normal LSSD functions.

Still a further object of the invention is to provide an improved LSI test method wherein the speed of testing depends only on the speed of the circuits inside the chip, independent of external hardware.

The above and other objects of the invention are realized by combining the advantages of high-speed built-in-test with the high fault resolution inherent in Level Sensitive Scan Design. The invention provides for easy on-chip test pattern generation by controllably interconnecting some of the shift register latches inside the chip into a maximal length feedback shift register to generate pseudorandom patterns. Responses inside the chip are analyzed by internal or external signature analysis. Internal signature analysis makes the chip completely self-testing. The only external stimuli needed are the system and scan clocks. Advantageously, the method is easily applied to any chip that has been designed to the LSSD discipline. Further, the invention requires a minimum of chip real estate, especially when the extra latches on the input and output pins are integrated with the I/O buffers normally present within a chip design. The amount of extra digital logic required is not significant.

The present invention is meant as an extension to the usual methods of testing an LSI chip. It is incorporated into the chips so as not to interfere with normal chip function. This allows A.C. characterization, parametric testing, and process fine-tuning to proceed with the usual combination of LSI testers and externally applied test vectors. The invention is used for exhaustive digital testing of the chip to uncover any internal faults. Use of the invention eliminates the costly test pattern generation phase of digital IC design, provides easy testability without using expensive LSI testers, and greatly improves the throughput of chip testing by allowing the self-test to proceed at maximum chip speeds and permitting many chips to be tested in parallel.

The self-test method of the present invention may also be used at the board and system test level, as well as providing automatic self-diagnosis of a digital system in the field. At a minimum, use of the present invention allows each chip to test itself in isolation from all other LSI chips and other digital logic to which it may be connected. This can be done in parallel across all the chips of a board or system. GO-NOGO signals from each chip can be collected by a maintenance processor for analysis, and transmitted to a remote diagnostic center if desired.

Simply stated, the method of the present invention as applied to a single chip may be summarized as follows:

(1) the pertinent input, output and interior latches of the chip are initialized to known values;

(2) the test mode is enabled, thereby configuring the linear feedback shift register within the chip;

(3) all system clocks are clocked, thereby capturing responses in the internal latches, which responses represent the response vectors to the internally generated pseudorandum test vectors;

(4) the output clock is clocked, thereby capturing primary outputs in the output latches;

(5) the contents of all internal and output latches are shifted out;

(6) steps (3), (4), and (5) are repreated until the test is complete; and (7) the "signature" obtained from the serial train of data at the appropriate output terminal is monitored; it it matches the expected signature, the chip has passed the test.

BRIEF DESCRIPTION OF THE DRAWINGS

The above and other objects, features and advantages of the present invention will be more apparent from the following more particular description, presented in connection with the accompanying drawings, wherein.

DETAILED DESCRIPTION OF THE INVENTION

Figure 1:
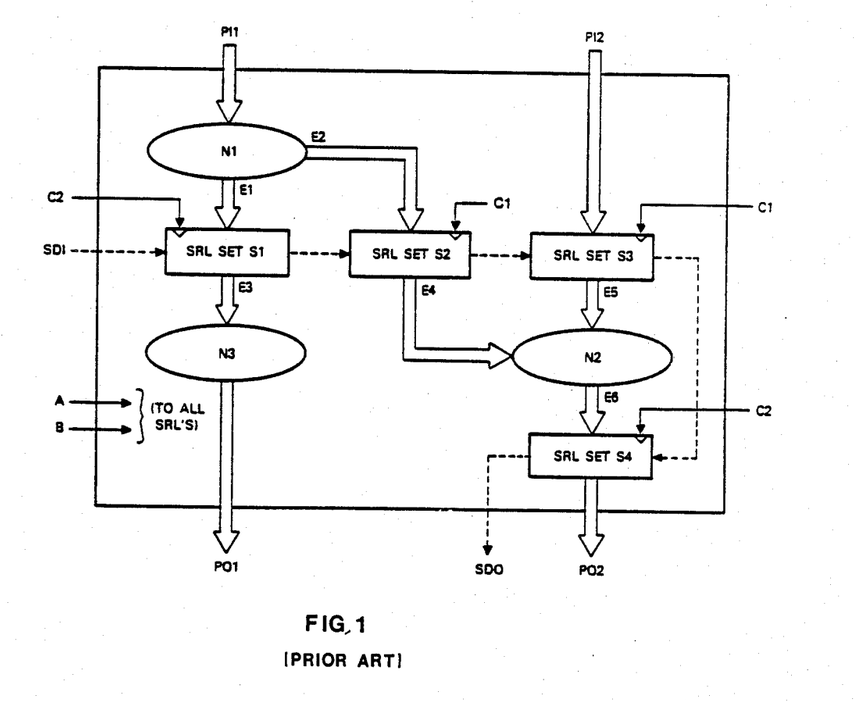
FIG. 1 depects a prior art chip configured for normal LSSD testing.

In order to better understand and appreciate the features of the present invention, it will be helpful to first review the chip configuration and test methods associated with normal Level Sensitive Scan Design. Accordingly, there is shown in FIG. 1 an example of a chip based on the usual LSSD technique. PI1 and PI2 are the primary inputs to the chip, and PO1 and PO2 are the primary outputs. It is to be understood that PI1, PI2, PO1 and PO2 may each represent an entire set of signal lines. E1 through E6 are the internal signal trunks among combinational networks N1, N2, and N3. The shift register latches are grouped into SRL sets S1, S2, S3, and S4. These SRL sets are chained into a long shift register from SDI (Scan Data In) to SDO (Scan Data Out), as shown by the dotted line. This shift register is shifted one position each time the non-concurrent clocks A and B are raised and lowered. The two system clocks to the chip are C1 and C2.

FIG. 1 demonstrates how the LSSD technique naturally partitions a chip into smaller combinational sub-networks such as N1, N2, and N3. This clearly reduces the testing effort. For example, network N1 can be tested independently of N2 and N3 by applying a pattern to PI1, allowing the network to settle, clocking E1 and E2 into SRL sets S1 and S2, and shifting out the contents of S1 and S2 for examination. Likewise, a pattern to test N3 can be shifted into S1, and N3's output can then be observed directly at PO1. Without the scan capability, N1's outputs would have to be propagated through S1 and N3, or S2, N2, and S4, masking many faults in N1 that could otherwise be detected. To stimulate N3, test patterns would have to go through N1 and S1, complicating the test generation process.

Normal LSSD testing of the chip in FIG. 1 is carried out as follows: (1) a pattern of ones and zeros is run through the main shift registers S1–S4 to verify the scan mode of the SRL's; (2) a pattern is applied to the primary inputs PI1; (3) a test pattern is shifted into the shift retgister; (4) all system clocks are successively clocked; (5) the primary outputs PO1 and PO2 are compared with expected responses; (6) the shift register contents are shifted out and compared to expected responses; (7) steps 2, 3, 4, 5 and 6 are repeated until the test is complete.

As above described, it can be seen that LSSD testing is a combination of parallel and serial pattern application and collection. Despite the reduction in the number of total test patterns brought about by the partitioning inherent in LSSD, this type of testing still has these drawbacks: (1) storage of stimuli and responses is required; (2) an LSI tester must be used, possibly fitted with additional hardware to do the shifting efficiently; (3) test pattern generation requires special complex software; and (4) the shifting of patterns into and out of a chip is inherently slow.

Figure 2:
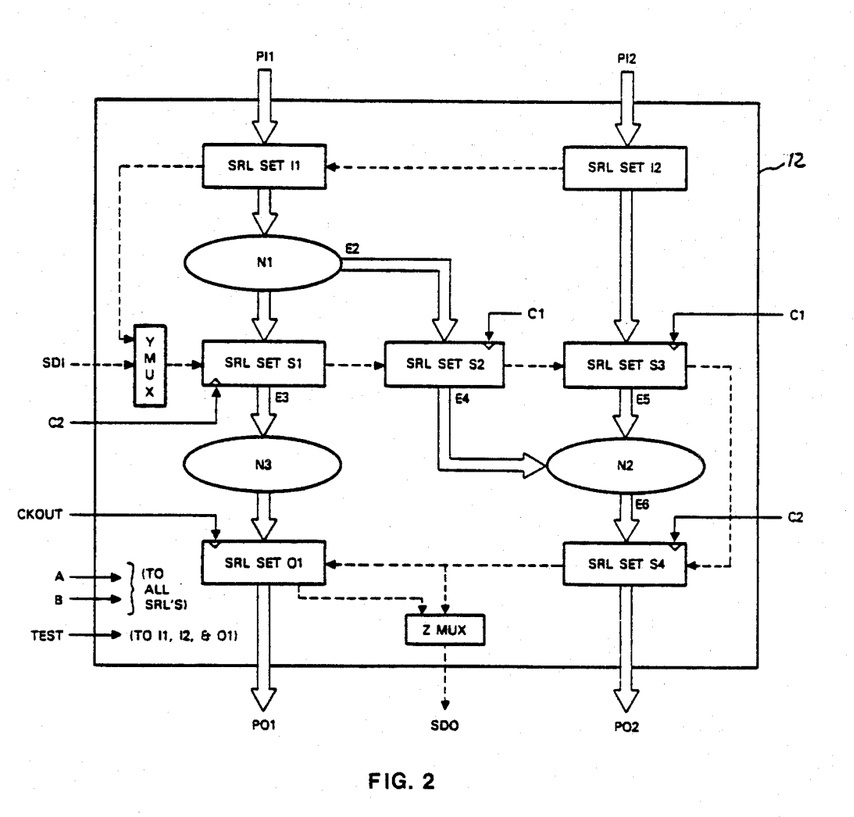
FIG. 2 shows a chip configured for the improved LSI self-test method of the present invention.

Referring next to FIG. 2, there is shown a chip 12 configured for use by the method of the present invention. SRL's I1 and I2 have been added to all the primary inputs of the chip, and SRL set O1 has been added to PO1. It is to be noted that the configuration shown in FIG. 2 is that assumed by the chip whenever the special input TEST is raised high. When TEST is low, as it is during normal system operation, SRL sets I1, I2, and O1 are transparent to PI1, PI2 and PO1, and the chip reverts back to a configuration similar to that of FIG. 1. Multiplexers Y MUX and Z MUX are included in FIG. 2 in order to allow the shift registers S1–S4 to function identical to FIG. 1 when the chip is not in its test mode.

Figure 3A:
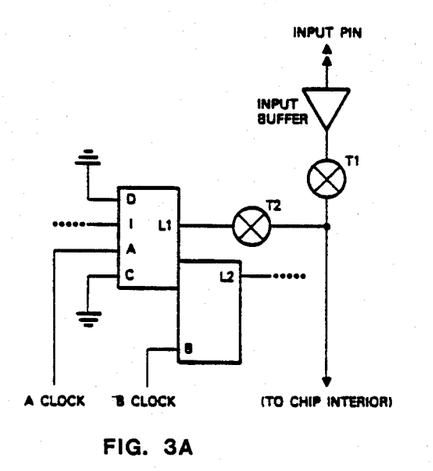
FIGS. 3A and 3B show the manner in which the input shift register latches and output shift register latches are connected to the input and output pins of the chip.
Figure 3B:
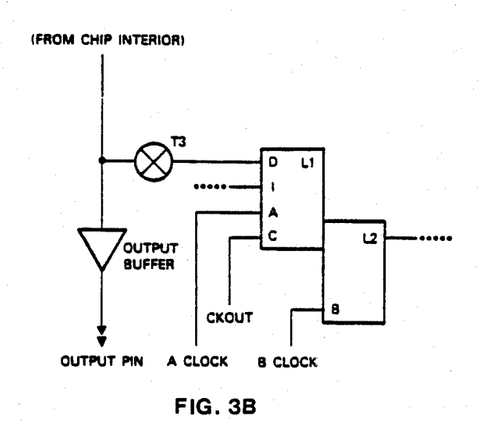

FIGS. 3A and 3B show respectively the connections of the input and output shift register latches to the pins of the chip. T1, T2, and T3 represent transmission gates in CMOS or pass transistors in NMOS. When the chip is put into the test mode, T1 is turned off, and T2 and T3 are turned on. This disables the exterior input pin and allows the input SRL to apply its L1 output to the interior input pin. The output SRL is allowed to sample the interior output pin with its D input. These input and output SRL's do away with the necessity of providing parallel external vectors to the primary inputs and collecting parallel responses on the primary outputs, as was the case with the chip configuration of FIG. 1. Note that no extra set of SRL's is required on PO2 in FIG. 2 because SRL set S4 already sources PO2. However, SRL set I2 has been added to PI2 despite the presence of S3. This seems redundant, but its necessity will be explained below.

Figure 4:
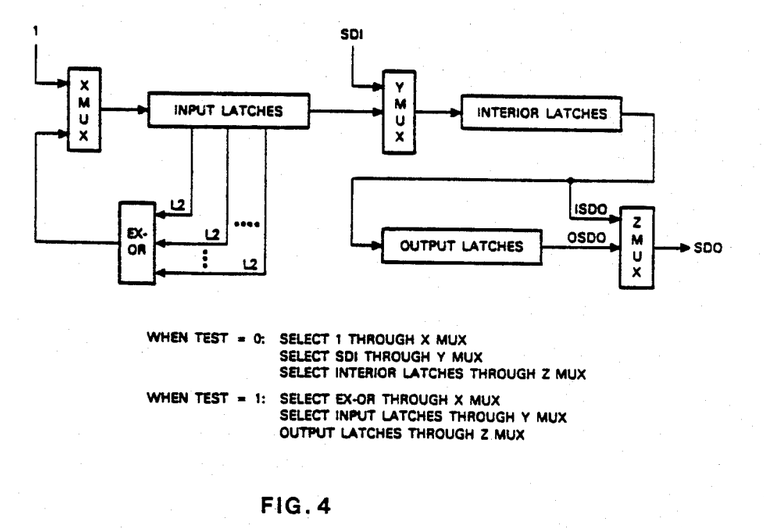
FIG. 4 shows how the latches of the chip are arranged while the test method of the present invention is being carried out.

The arrangement of all the latches of FIG. 2 for the test method of the present invention is shown in FIG. 4. Those latches normally present in LSSD-based LSI chips (i.e., those included in FIG. 1) are called interior latches (e.g. S1, S2, S3, and S4). Those latches added in FIG. 2 to all primary inputs are called input latches (I1 and I2), while those added to the primary outputs are called output latches (O1). Note that S4 in FIG. 2 is considered an interior latch even though it is connected to primary outputs PO2 because it functions in system mode while the other output latches function only in test mode.

As illustrated in FIG. 4, the input latches are connected in a long feedback shift register via their L2 outputs. This shift register provides the pseudorandom test patterns for the self-test method. These test patterns represent the sole source of stimulus needed, other than the clock signals, for testing the chip. The internal and output latches collect the responses to these patterns and shift the responses out to the terminal SDO, where they may be collected by appropriate test equipment, such as a signature analyzer. During the test mode, the input, interior, and output latches form one long shift register that is shifted by the common A and B clocks. The interior latches also have their normal system clocks connected to their C clock input; and the output latches receive a special system clock, CKOUT. The input latches are never clocked by a system clock, so their D and C inputs are grounded (FIG. 3).

Figure 5:
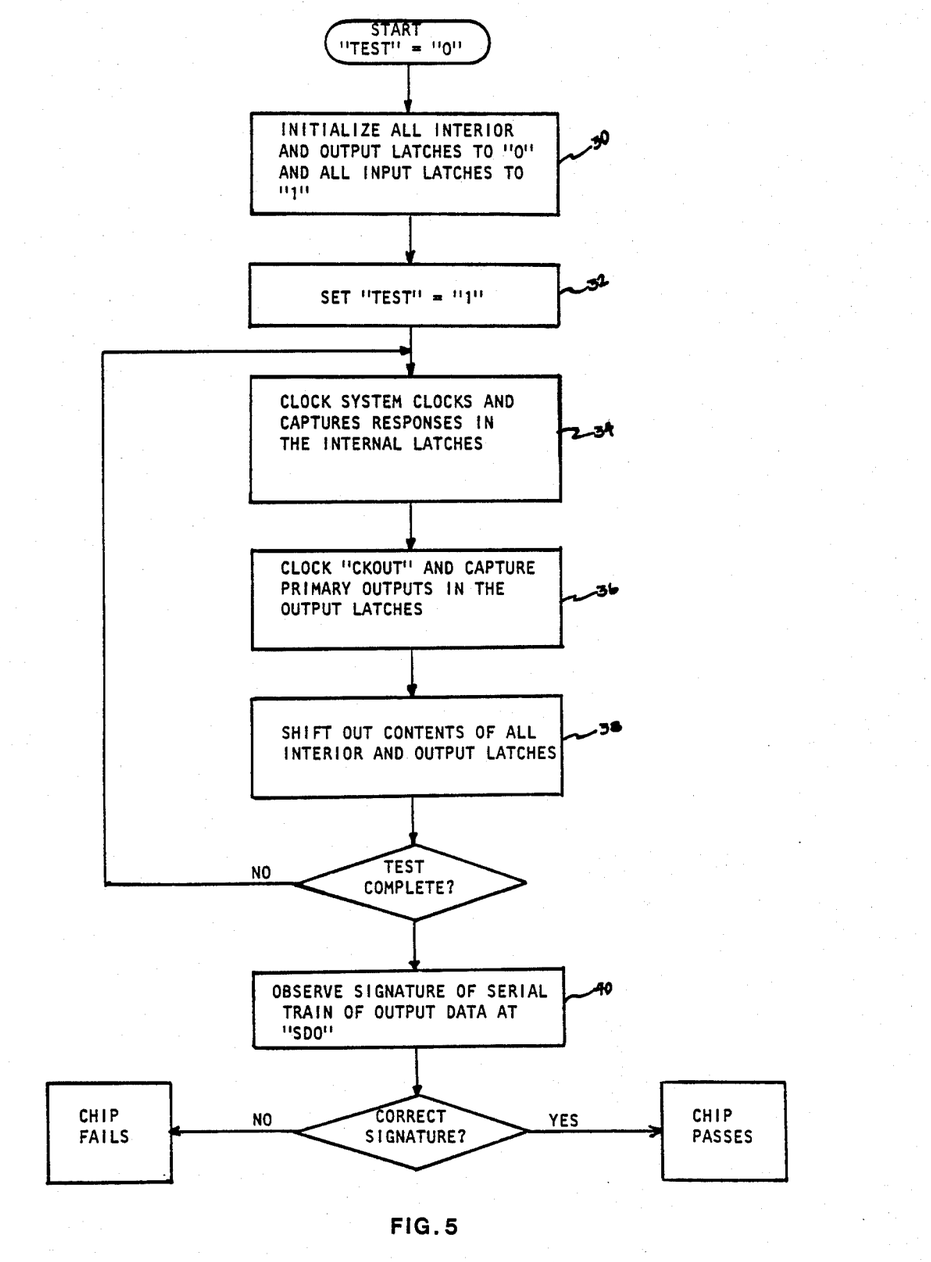
FIG. 5 is a simplified flow diagram of the steps involved when a single chip is tested according to the present invention.

Using the test configuration of FIG. 4, the test method of the present invention may be carried out as shown in the flow diagram of FIG. 5.

In FIG. 5, an initilization step 30 provides a deterministic starting point for the self-test. The input latches must not be cleared to zeros or the feedback shift register would stay locked in a zero state forever. In order to avoid this possibility, the input latches are set to ones by providing enough A and B clocks. The X MUX in FIG. 4 selects a "one" to the input shift register when the signal TEST is low. Then when the signal TEST is raised, in step 32, the X MUX selects the output of the exclusive-or network and the input latches become a feedback shift register.

After all latches have been initialized in step 30, and the feedback shift register is made operable, in step 32, the first test pattern is applied inside the chip. For example, SRL Set I1 in FIG. 2 stimulates network N1, S1 stimulates N3, S2 stimulates N2, etc. Clocking the system clocks C1 and C2 allows S1, S2, and S4 to capture the responses of N1 and N2, as described in step 34 of FIG. 5. Similarly, clocking CKOUT allows SRL Set O1 to capute N3, as described in step 36 of FIG. 5

As soon as the contents of the interior and output latches are shifted out (step 38, FIG. 5) the input latches receive new pseudorandom patterns. In fact, each transition of the A and B clocks loads a new pattern into the input latches. Thus, as the contents of the interior and output latches are shifted out, pseudorandom patterns are shifted into the interior latches from the feedback shift register. As the test advances, all input and interior latches are seeded with a random distribution of ones and zeroes, and this random distribution is applied not only at the inputs, but throughout the interior of the chip, leading to a thorough stimulation of the chip. Moreover, since there are normally at least several dozen input latches, the period of the shift register can be made very long. Only one of every m random patterns need is used for a stimulus pattern, where m is the total number of interior and output latches. This is because the random patterns produced during the shifting out of the responses are thrown out. It is only after the data is shifted out, and the system and CKOUT clocks are applied again, that a random pattern is used. Thus, for n input latches, the total number of patterns available for testing is $(2^n - 1)/m$.

It is to be noted that any type of suitable test vector generator could be employed with the test method described herein, such as counters, state machines, and internal Read Only Memories (ROM's). However, in the preferred embodiment, the feedback shift register made from the input latches (FIG. 4) provides the most efficient test vector generator available, in that the cost—in terms of design time and chip real estate—of a pseudorandom test generator is less than the cost of other types of test vector generators.

Figure 6:
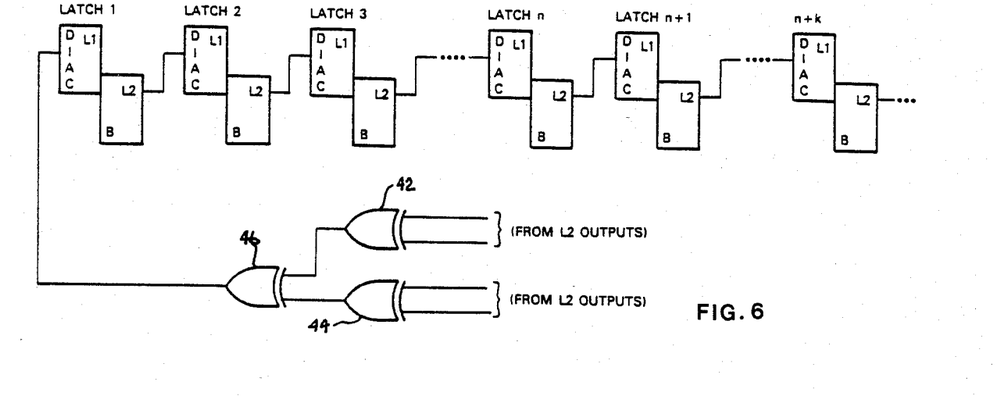
FIG. 6 depicts the manner in which an internal pseudorandom test pattern generator may be configured using the SRL's in the chip and some simple combinational logic elements.

The theory supporting the generation of pseudorandom sequences through the use of linear feedback shift registers is somewhat complex, yet is known by those skilled in the art. Accordingly, it will not be repeated herein. The implementation of a pseudorandom test pattern generator (PTPG) is quite straightforward, and is also known by those skilled in the art. Basically, the implementation involves interconnecting a series of latch circuits in a shift register configuration and selectively chosing feedback paths that are coupled back to the input through one or more exclusive or gates. FIG. 6 shows how such a PTPG could be implemented using the SRL's of the chip to be tested. It is to be noted that the specific L2 outputs that are used for the feedback paths is determined by the number of latches n in the shift register.

For each choice of n, there are a number of choices involving the feedback terms needed to produce pseudorandom patterns. These feedback terms are given by the irreducible polynominals of degree n whose period is $2^n-1$ (primitive polnominals). Tables of all irreducible polynominals, including primitive polynomials, from n=2 to 34, are known in the art. See Peterson, Wesley W., *Error Correcting Codes*, The MIT Press, Cambridge, Mass., 1961, pp. 251–270. Of the primitive polynomials for each n, the one with the fewest non-zero coefficients is preferred so as to minimize the feedback logic required in the PTPG. Table 1 gives the minimum feedback terms in the PTPG for each n from 20 to 34. For example, for n=24 the L2 outputs of latches 24, 7, 2, and 1, numbering the latches from left to right as shown in FIG. 6, should serve as inputs to the exclusive or gates 42 and 44. Note that the maximum number of terms in the table is four, so that three two-input exclusive-or gates 42, 44, and 46 for the feedback logic will suffice. The other entry in Table 1 indicates the number of pseudorandom vectors that will be produced for each n before the cycle repeats, this number being $2^n-1$. As mentioned previously, the actual number of vectors available for LSSD self-test is $(2^n-1)/m$ where m is total number of interior and output latches, since the m random vectors produced during the shifting out of these latches are thrown away. With m on the order of 1000, it is preferred that n be at least 20 in order to produce enough test vectors for adequate testability.

If there are not enough input pins and input latches available to produce an adequate number of test vectors, feedback terms must be used from some of the interior or output latches. When this is done, however, it is impossible to guarantee that the feedback shift register will be maximal length and won't hang up in some short repeating cycle of vectors. This "hang up" possibility exists because the interior and output latches are loaded from logic outside the feedback shift register whenever the system clocks or CKOUT are used in the test cycle. In order to avoid such a possibility, SRL Set I2 has been included in FIG. 2 instead of using S3 as part of the feedback shift register. This explains the seeming redundancy of I2. It is noted that input latches are always shifted and never loaded from their D inputs.

The responses from the test vectors generated by the PTPG inside the LSI chip are collected in the interior and output latches. In normal LSSD testing these responses are shifted out and compared to known good responses. When the method of the present invention is used, however, comparison vectors are advantageously eliminated by performing a signature analysis on the responses being shifted out.

The theory of signature analysis is well documented in the art, see Frohwerk, supra, and will not be repeated in detail herein. Basically, however, when signature analysis is used, a signature analyzer compresses an indefinitely long serial stream of data into an n-bit "signature". If the LSI chip has a fault and that fault is stimulated by a pseudorandom vector, then the response vectors being shifted out of the chip, viewed as a continuous m-bit-long serial bit stream at SDO (FIG. 2), cause the signature from the signature analyzer to differ from the expected signature with a probability very close to one. For example, if a 16-bit signature analyzer is used, it can be shown that the probability of failing to detect an error in a continuous m-bit-long stream is only $1.53 \times 10^{-5}$.

A signature analyzer may be described as a maximal-length feedback shift register with an exclusive-or gate added in the serial input line. Signature analyzers may be purchased commercially, for example from Hewlett Packard, or they may be easily fabricated from commercially available integrated circuits or from available SRL's and other logic elements on the chip to be tested.

Figure 7:
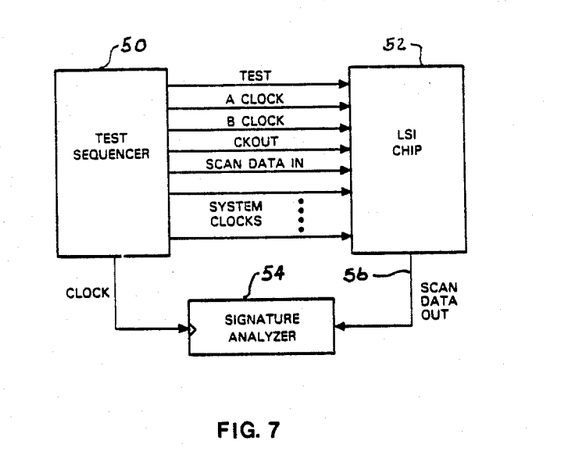
FIG. 7 is a test set-up that could be employed in order to implement the test method of the present invention.

FIG. 7 shows a test set up that could be used in carrying out the test method of the present invention. The test sequencer 50 is a simple piece of hardware that initializes the LSI chip 52 and then drives it through the prescribed self-test sequence. This sequence consists of nothing more than cycling the A, B, CKOUT, and system clocks in the right sequence and then stopping after a specified number of cycles for the test. If speed is not a problem, a microprocessor could be used for this purpose. The signature analyzer 54 may be commercially bought or custom built. The test sequencer 50 clocks the signature analyzer 54 for each cycle of both A and B clocks, so that each bit shifted out at SDO output 56 is shifted into the signature analyzer 54. Of course, if an LSI tester is available, it could replace both the test sequencer and the signature analyzer, since the signature analysis could be performed by those skilled in the art by collecting the serial data stream at the SDO output 56 and reducing it by appropriate software.

The use of external signature analysis as shown in FIG. 7 is acceptable for wafer probe and package test, but becomes increasingly burdensome when used in printed circuit board test, system test, and self-diagnosis in the field. It is clear, for example, from FIG. 7 that any number of LSI chips 52 could be driven in parallel by the test sequencer 50 since the clock sequencing is the same for any of the chips. The number of cycles needed for a complete test differs for each unique integrated circuit, but if a set of chips are tested in parallel, the number of cycles run would be that of the chip requiring the maximum number. Running the other chips beyond the number needed for their complete testability would not destroy the validity of the test. However, requiring an external signature analyzer to collect the responses from a chip makes it impossible to test chips in parallel (unless a separate signature analyzer is used for each chip), and makes board test and system test, using the method described, slow and laborious.

Figure 8:
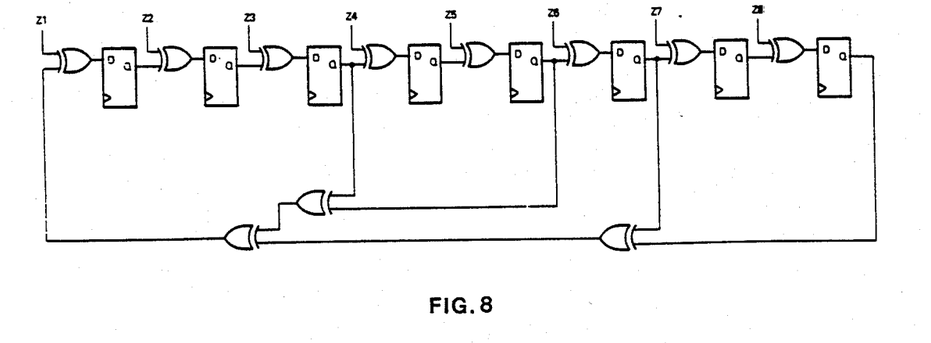
FIG. 8 shows an 8-bit multiple input parallel signature register that could be used with the present invention.

In order to obviate the above problems, the signature analyzer may be placed inside the chip 52 and a GO-NOGO indication may then be used to signal the result of the test, provided the signature analysis does not use up an inordinate amount of chip real estate. A multiple input signature register for parallel signature analysis, such as is shown in FIG. 8, could be used for this purpose with a minimum investment in silicon real estate. The multiple input signature register of FIG. 8 computes the signature in parallel across the eight-bit word Z1–Z8 in a single clock cycle. Using an 8-bit instead of a 16-bit signature has a neglible effect on the probability of detecting an error. Bit inversions on the response vectors are still detected with a 99.6 percent probability, and the reduction in length saves eight exclusive-or gates from what would be required if a 16-bit multiple input signature register were used.

Figure 9:
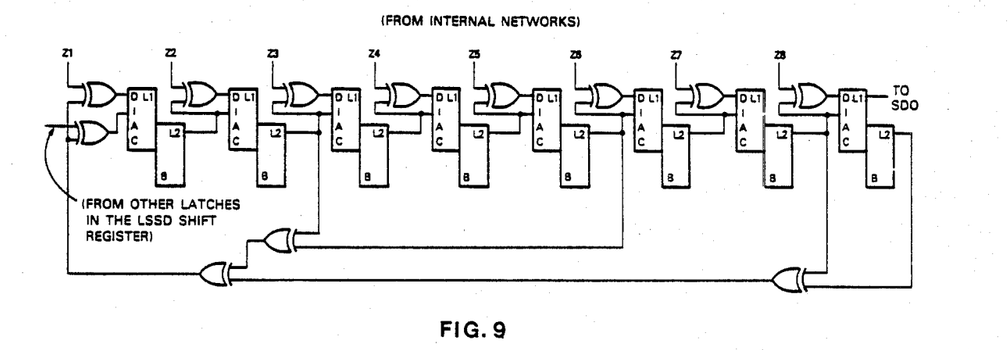
FIG. 9 shows how the 8-bit register of FIG. 8 could be implemented using the SRL's of Set 01 of the chip shown in FIG. 2.

The multiple input signature register of FIG. 8 may advantageously be incorporated into the method of the present invention by adding it to the last eight output latches of SRL Set O1 (FIG. 2) before the SDO output and allowing this register to compute a serial signature during the shift out phase of the test. This is illustrated in FIG. 9. When the output latches are parallel-loaded with CKOUT, the signature register will compute the signature in parallel, using the contents of all L2 latches exclusive-or'ed with the incoming eight-bit word, Z1–Z8. The contents of the L2 latches are used in order to prevent race conditions with the contents of the L1 latches being parallel loaded. It is noted that L2 SRL's can be used in the computation of the signature because the contents of the L1 and L2 SRL's are always identical after a sequence of shifting caused by successive clocking of the A and B clocks, and further because the output latches are loaded only once before a shift out is done. Note that a signature computation on successive parallel words requires that L1 be transferred to L2 after each parallel load. When the shift out sequence of the test begins, a B clock transfers the contents of L1 to L2. Thereafter, the signature register of FIG. 9 will serially compute the signature as the data from the interior and other output latches is shifted through it. When the test is done, the final signature may be either shifted out from the chip; or, preferably, it may be internally compared to the expected signature, and a GO-NOGO output signal may be provided on a single line. The latter scheme is excellent for system diagnosis because a maintenance processor can cause all of the chips in a digital system to be tested simulataneously, the final diagnosis consisting merely in examining the GO-NOGO pin of each chip at the end of the test. It also lends itself to remote diagnosis because almost no test data has to be transmitted between the diagnostic center and the remote site.

Whichever alternative for signature analysis is chosen, the comparison (expected) signature can be computed in two distinct ways. The first way is to use the original fault simulation of the chip that was performed to obtain the test score. With the test method of the present invention, fault simulation requires no input test vectors as before. Rather, the clocks to the chip are cycled until the fault test score reaches an acceptable level. Comparison between the good machine and the faulty machines in the fault simulation need only be done on the SDO output. As the fault simulation proceeds, the serial output on SDO for the good machine can be collected and later reduced to a signature by software. This signature is the expected signature to be used in wafer probe and package test. The second method of obtaining a signature is to fabricate a chip and test it throughly using functional test vectors or the self-test method of the present invention with the signature obtained from simulation. The second method is the one to be used to derive signatures for board test, system test, or field diagnosis. In these types of tests, all chips are run for the same number of cycles, some chips being tested for much longer than they normally would be in wafer probe and package test. In order not to waste large amounts of computer time for simulation to obtain the expected signature, pre-tested and known-good chips can simply be run the desired number of cycles. If an external signature analyzer is used, the expected signature is available immediately when the clock cycling stops. If the signature is computed internally, it will be available in the signature register shown in FIG. 9 and can be scanned out with eight A and B clocks. Note that the exclusive-or gates in the feedback path of the signature register do not interfere with the scanning out of the data already in the signature register.

It is thus seen that the self test method of the present invention offers the following advantages:
1. it is transparent to normal chip operation;
2. it doesn't interfere with parallel vector testing; and
3. it doesn't interfere with any of the usual LSSD scan-in and scan-out capabilities.

Moreover, it is noted that the present self-test method is an enhancement to a chip and not just an alternative way of testing it. In particular, AC characterization and parametric testing can still be run without interference using the usual LSI testers. It is after a new design or integrated circuit (IC) process has been debugged that the present self-test method comes into play. Through the use of internal signature analysis, the self-test method described herein permits many chips to be tested simultaneously at high speeds using inexpensive test sequencers, such as is illustrated in FIG. 7. This permits a much higher throughput from the test facility of an IC foundry and frees up the expensive LSI testers for use in debug work or fine-tuning a design or process.

Figure 10:
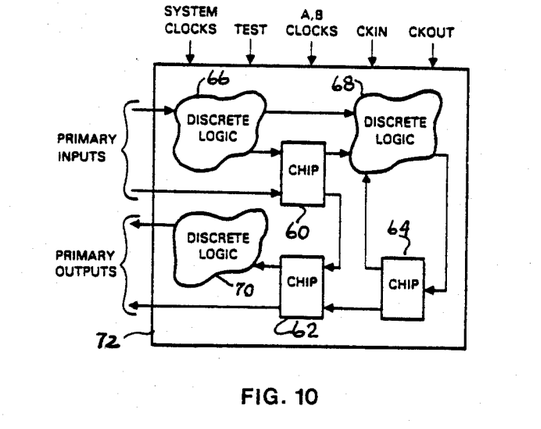
FIG. 10 shows the use of the chip of the present invention on a board with discrete logic, and is used to help illustrate how the method of the present invention could be used to test such a configuration.

Referring next to FIG. 10, there is shown a board 72 on which three LSI chips 60, 62, and 64 are intermixed with groups of discrete logic 66, 68, and 70. The groups of discrete logic typically comprise buffers, registers, parity checkers, and miscellaneous gating logic. FIG. 10 illustrates all of the interconnection possibilities between the primary inputs and outputs of the board 72, the LSI chips 60–64, and the groups of discrete logic 66–70.

The present test method described thus far allows each chip 60, 62, or 64 to be tested in isolation from all other chips and discrete logic. However, as is described below, the present test method also can be used to enhance board and system test.

In order to carry out the enhanced board and system tests, it is necessary that paths exist from the edge of the board 72 to the SDI, SDO, A, B, and system clock inputs of each chip. If any of these signals are gated by discrete logic during normal system operation, multiplexers or equivalent must be used to allow these direct paths to exist during the test mode. If these direct paths exist, then the chips 60–64 may be tested by attaching a test sequencer to the edge of the board 72 to cycle the clocks, as described previously in connection with individual chip testing. Signature analysis may then be performed on the SDO pins of each chip; or, if internal signature analysis is added to the chips, the GO-NOGO outputs may be monitored at the end of the test. This mode of testing, referred to as TEST MODE 1, thus becomes a straightforward extension of system test and can be used to identify a faulty chip within a complex system where several such chips are used.

Figure 11:
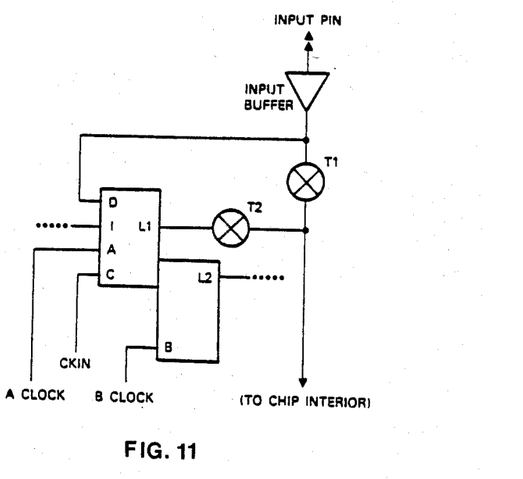
FIG. 11 shows how the input latches of the chip could be modified in order to sample data on the input pins.

In order to allow the discrete logic on the board 72 to be tested as well, a modification is made to the input latches inside each chip. This modification is shown in FIG. 11. With the modification of FIG. 11 in place, the input latches can sample the data on the input pins when CKIN is toggled. Each chip thus becomes a control/observation point for the entire system, and the pseudo-random test pattern generators inside each chip can provide random vectors external to the chip through the chip primary outputs. Also, the chip input latches may sample external signals, allowing these sampled input signals to be compressed into a signature, which signature may then be analyzed to determine if it is a good or bad signature. This mode of testing, referred to as TEST MODE 2, thus allows the discrete logic 66–70 to be stimulated, and the corresponding responses captured, by the chips 60–64 resident on the same board 72.

Figure 12:
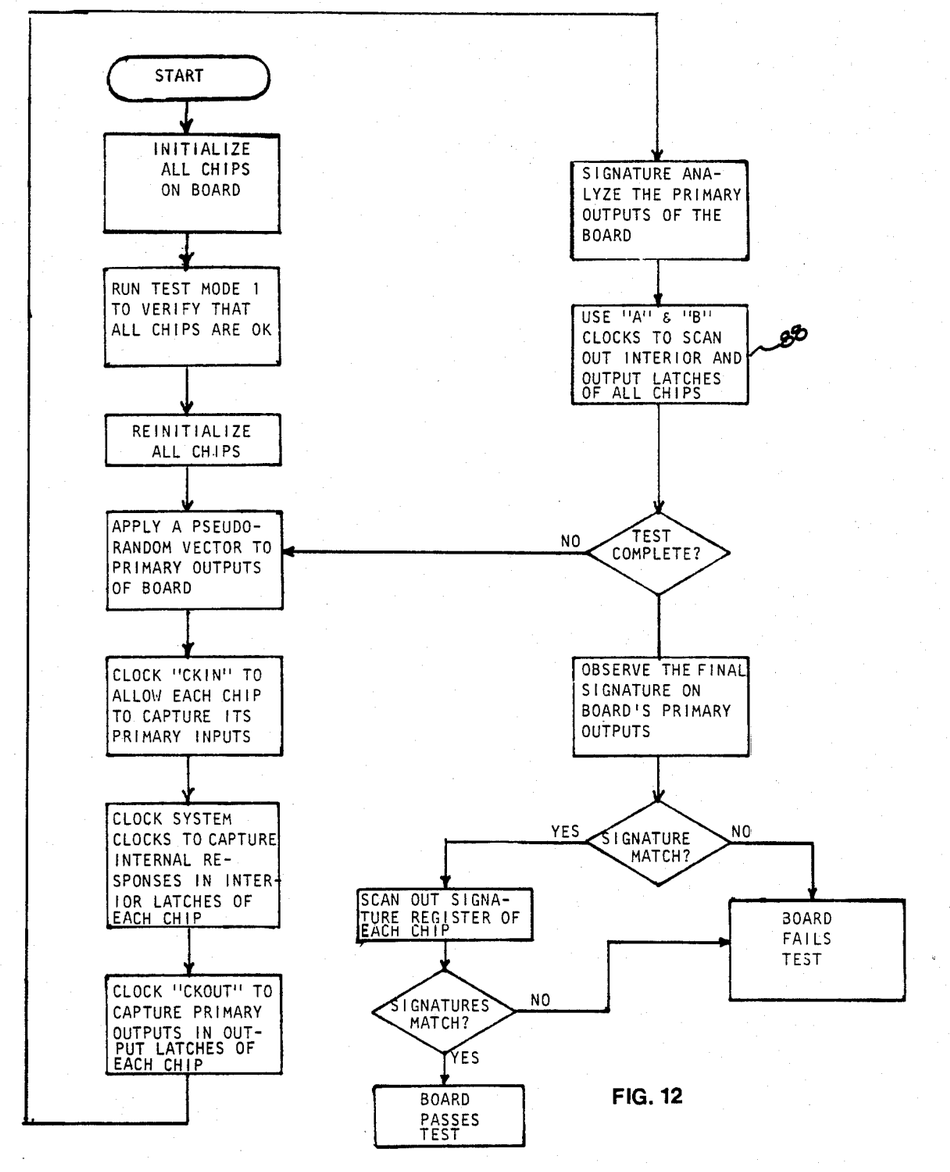
FIG. 12 is a flow diagram of the steps followed when the present invention is used to test an entire board containing both LSi and discrete logic, such as is shown in FIG. 10.

A complete board test sequence for TEST MODE 2 of the present invention may be carried out as shown in the flow diagram of FIG. 12. In the test sequence of FIG. 12, it is preferred that the board 72 be attached to a card-edge tester or to a customer-designed test sequencer, thus eliminating the difficulty and expense associated with using an in-circuit tester and applying externally generated test vectors. The test sequencer required could be readily designed and fabricated by those skilled in the art, and need contain little more than: (1) a PTPG to stimulate the primary inputs; (2) a multiple-input signature register to compress the primary outputs; and (3) control logic to sequence the clocks. Expected signatures can be derived by sequencing known good boards, that have been thoroughly functionally tested, through the test.

As above described, TEST MODE 2 of the present invention (FIG. 12), offers the same advantages for boards as it does for chips, i.e., high-speed, low-cost, thorough testing. To illustrate, if the clocks of TEST MODE 2 are applied every 100 nanoseconds, and 100 interior and output latches are shifted out each cycle (step 88 in FIG. 12), about 5000 random vectors can still be applied every second to the board. This is 18 million vectors every minute. If a fault is present anywhere in the discrete logic, the traces on the bord, or in any of the chips, it will be detected in the signature analysis of such a large number of test vectors.

TEST MODE 2 can be extended to a TEST MODE 3 system test level by applying the same principles previously described. However, care must be exercised in carrying out such a system level test in order to controllably coordinate the generation, delivery, receipt, and analysis of the various test vectors.

While the present invention has been described by reference to preferred embodiments thereof, numerous variations and modifications could be made thereto by those skilled in the art without departing from the spirit and scope of the invention.

What is claimed is:

1. An improved method of testing a combination of logic elements that includes a plurality of combinational networks, input means for selectively entering data into said networks, said input means including a group of input shift register latches, output means for selectively exiting data from said networks, and a plurality of sequential circuit means for selectively passing data between said combinational networks, said sequential circuit means having access for selectively and independently scanning data therethrough, said method comprising the steps of:
   (a) isolating all of said sequential circuit means into a plurality of sets of sequential circuits, at least one set being associated with each of said combinational networks;
   (b) internally generating a data test pattern by:
      (1) selectively configuring a plurality of said input shift register latches into a feedback shift register having at least one logic gate in its feedback path that combines the outputs of a plurality of said shift register latches with an exclusive-or function,
      (2) initializing each of the shift register latches of said feedback shift register to a prescribed state; and
      (3) clocking said feedback shift register so as to produce a serial pseudorandom test pattern;
   (c) scanning said test pattern into said sequential circuit means through said scanning access;
   (d) applying said test pattern to at least one of said combinational networks through said input means so that an output response pattern is obtained;
   (e) clocking said output response pattern of said combination network into one of said respective sequential circuit means;
   (f) scanning out, through said scanning access, the resulting response patterns held in said sequential circuit means;
   (g) analyzing said response pattern for an indication of the test status of the combinational networks tested; and
   (h) repeating steps (b) through (g), as desired, until all of the combinational networks have been tested.

2. A method as defined in claim 1 further including an initialization step comprising shifting known data patterns through initialization steps said sequential circuit means, input means, and output means in order to verify that data is properly shifted therethrough.

3. A method as defined in claim 1 wherein the feedback shift register is at least 20 bits long.

4. A method as defined in claim 1 wherein step (g) of analyzing said response patterns comprises:
   (1) deriving a signature representative of a correct response by said combinational networks to said test patterns;
   (2) determining a signature corresponding to said response patterns, and
   (3) comparing said determined signature with said derived signature for an indication of the test status of said networks.

5. A method as defined in claim 4 wherein step (g) (2) comprises using a signature register into which said response patterns are clocked, said signature register having a feedback path therearound that combines selected outputs from the register elements using exclusive-or gates.

6. A method as defined in claim 5 wherein said output means includes a group of output shift register latches and wherein said signature register is configured from a plurality of said output shift register latches.

7. A method as defined in claim 6 wherein said signature register is an 8-bit multiple-input parallel signature register.

8. A method as defined in claim 6 wherein step (g) (3) comprises selectively comparing the contents of said signature register with the signature derived in step (g)(1), and providing a single NO-NOGO signal indicative of the results of said comparison.

9. A method for testing an LSI circuit chip by stimulating the internal logic elements thereof with substantially all of the possible bit combinations that said chip is likely to encounter, said internal logic elements including a large number of shift register latches and a plurality of combinational networks, said shift register latches being grouped into sets that comprise: input shift register latches interposed between input pins and internal logic elements of said chip, output shift register latches interposed between output pins and internal logic elements of said chip, and internal shift register latches coupled to said combinational networks and selected pins of said chip, said internal shift register latches having scan-in data means for selectively allowing data to be scanned thereinto, and scan-out data means for selectively allowing data to be scanned thereout of, said method comprising the steps of:
   (a) partitioning said combinational networks into a plurality of sets, each set having a corresponding partitioned internal shift register latch that receives or sends its data contents from or to its respective combinational network;

(b) generating a repetitive test pattern internal to said chip;
(c) scanning said test pattern through said internal shift register latches via said scan-in data means;
(d) applying at least a portion of said test pattern, as held in a given set of said internal shift registers, to at least one of said combinational networks so that an output response pattern is obtained;
(e) clocking the output response pattern thus obtained into a corresponding set of internal shift registers;
(f) scanning said output response pattern out of said internal shift register set via said scan-out data means;
(g) analyzing said output response pattern for an indication of the test status of the networks tested; and
(h) repeating steps (b) through (g), as needed, in order to test other networks within said chip.

10. A method as defined in claim 9 wherein said repetative test pattern of step (b) is a pseudorandom test pattern having a length of at least 1000 test vectors.

11. A method as defined in claim 10 wherein said psuedorandom test pattern is generated by selectively configuring a plurality of said internal shift register latches as a long feedback shift register.

12. A method as defined in claim 11 wherein said output response pattern is analyzed in step (g) by determining a signature associated with said output response pattern and comparing said determined signature with a derived signature representative of a properly functioning network.

13. A method as defined in claim 12 wherein said signature of said output response pattern is determined internal to said chip using a signature register.

14. A method as defined in claim 13 wherein said signature register is configured using a plurality of said output shift register latches and a plurality of exclusive-or gates.

15. A method as defined in claim 14 wherein said chip further includes internal comparison means for comparing the signature of the output response pattern to the derived signature, and wherein the method further includes the step of signaling the test status resulting from said comparison with a GO-NOGO signal.

* * * * *